United States Patent
Neumann et al.

(10) Patent No.: US 12,045,969 B2
(45) Date of Patent: Jul. 23, 2024

(54) AUTOMATED ROOT CAUSE ANALYSIS FOR DEFECT DETECTION DURING FABRICATION PROCESSES OF SEMICONDUCTOR STRUCTURES

(71) Applicant: Carl Zeiss SMT GmbH, Oberkochen (DE)

(72) Inventors: Jens Timo Neumann, Aalen (DE); Eugen Foca, Ellwangen (DE); Ramani Pichumani, Palo Alto, CA (US); Abhilash Srikantha, Neu-Ulm (DE); Christian Wojek, Aalen (DE); Thomas Korb, Schwaebisch Gmuend (DE); Joaquin Correa, Oakland, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 848 days.

(21) Appl. No.: 17/034,640

(22) Filed: Sep. 28, 2020

(65) Prior Publication Data

US 2021/0097673 A1    Apr. 1, 2021

Related U.S. Application Data

(60) Provisional application No. 62/908,822, filed on Oct. 1, 2019.

(51) Int. Cl.
*G06K 9/00* (2022.01)
*G06T 7/00* (2017.01)
*H01L 21/66* (2006.01)

(52) U.S. Cl.
CPC ............ *G06T 7/0004* (2013.01); *H01L 22/26* (2013.01); *G06T 2207/10061* (2013.01); *G06T 2207/20081* (2013.01); *G06T 2207/30148* (2013.01)

(58) Field of Classification Search
CPC ......... G06T 7/0004; G06T 2207/10061; G06T 2207/20081; G06T 2207/30148; G06T 2207/20084; G06T 7/0002–0008; G06N 3/02–105
See application file for complete search history.

(56) References Cited

U.S. PATENT DOCUMENTS

| | | | |
|---|---|---|---|
| 2007/0280526 A1* | 12/2007 | Malik | G06T 7/001 382/149 |
| 2017/0109646 A1* | 4/2017 | David | G03F 7/70625 |
| 2019/0108396 A1* | 4/2019 | Dal Mutto | G06V 20/52 |

(Continued)

OTHER PUBLICATIONS

Zhang, Zhibo, Prakhar Jaiswal, and Rahul Rai. "Featurenet: Machining feature recognition based on 3d convolution neural network." Computer-Aided Design 101 (2018): 12-22. (Year: 2018).*

*Primary Examiner* — Emily C Terrell
*Assistant Examiner* — Owais Iqbal Memon
(74) *Attorney, Agent, or Firm* — Fish & Richardson P.C.

(57) ABSTRACT

A method includes obtaining at least one 2-D image dataset of semiconductor structures formed on a wafer including one or more defects during a wafer run of a wafer using a predefined fabrication process. The method also includes determining, based on at least one machine-learning algorithm trained on prior knowledge of the fabrication process and based on the at least one 2-D image dataset, one or more process deviations of the wafer run from the predefined fabrication process as a root cause of the one or more defects. A 3-D image dataset may be determined as a hidden variable.

20 Claims, 14 Drawing Sheets

(56) References Cited

U.S. PATENT DOCUMENTS

| | | | |
|---|---|---|---|
| 2019/0279840 A1* | 9/2019 | Teo | G01N 23/2251 |
| 2019/0287230 A1* | 9/2019 | Lu | G06N 3/088 |
| 2019/0287238 A1* | 9/2019 | Sriraman | G06N 20/00 |
| 2020/0020092 A1* | 1/2020 | Fang | G06F 18/24 |
| 2021/0073972 A1* | 3/2021 | Wu | G06N 3/08 |

* cited by examiner

FIG. 1 Wafer having semiconductor devices with defects
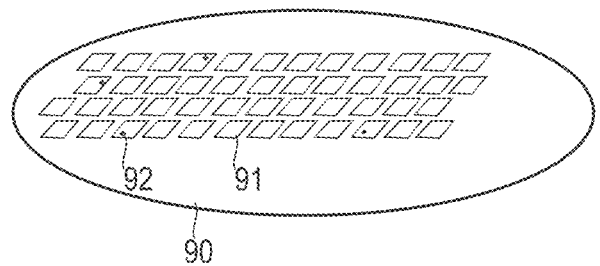
FIG. 2
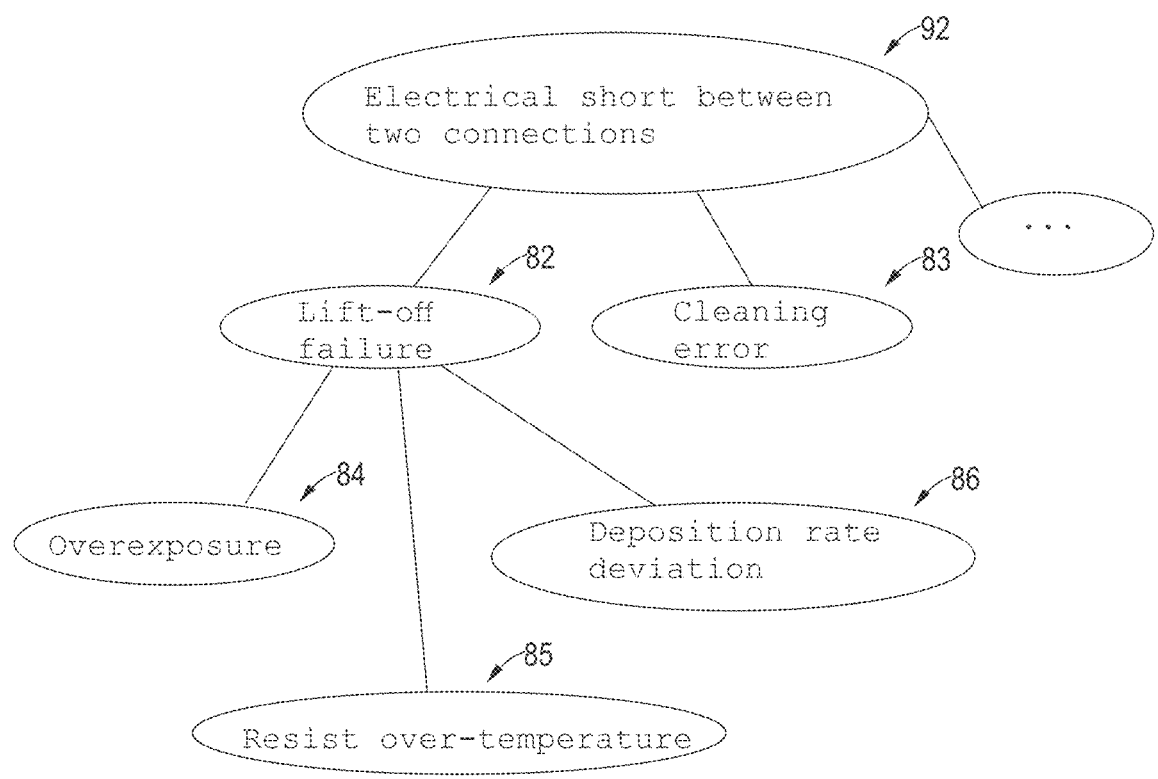

FIG. 6 Algorithm receiving inputs and providing outputs
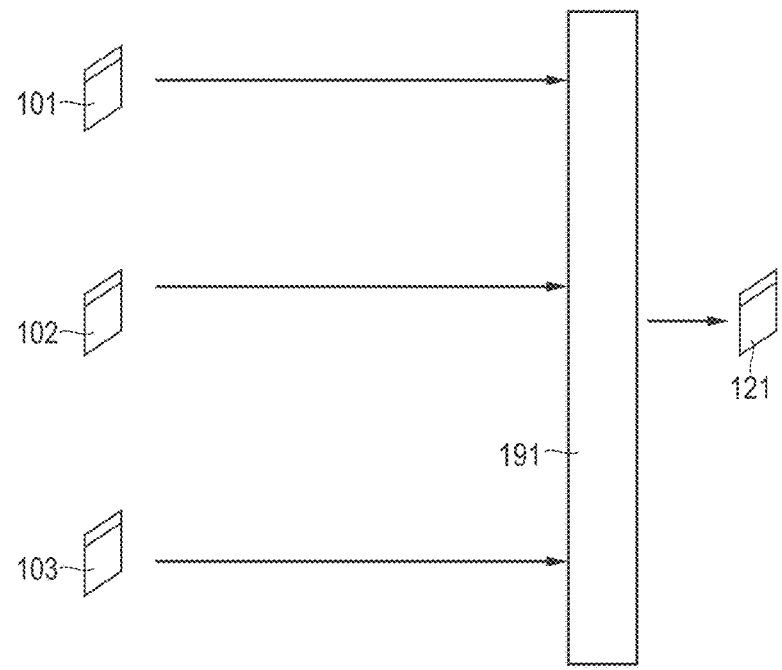
FIG. 7 Algorithms to identify root cause target variable
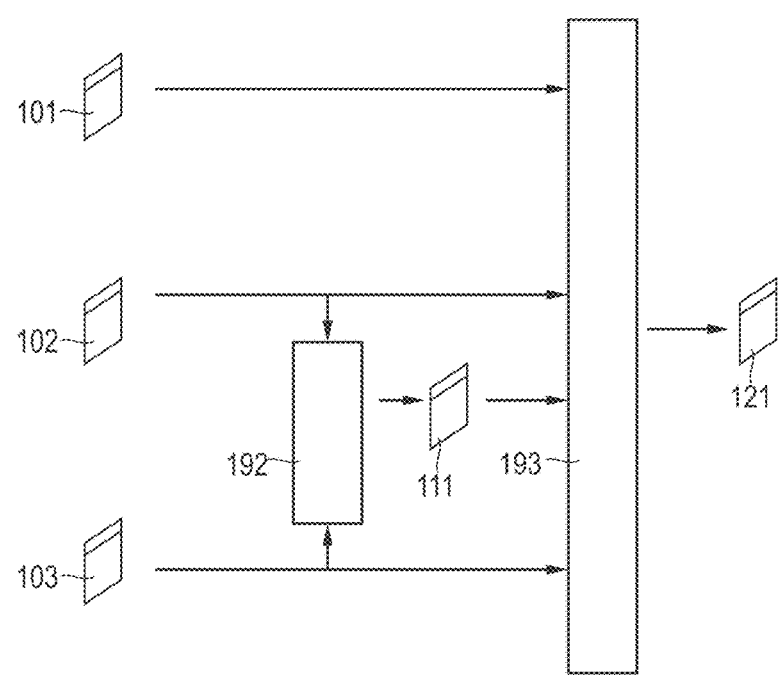

FIG. 8 Structure-based algorithm
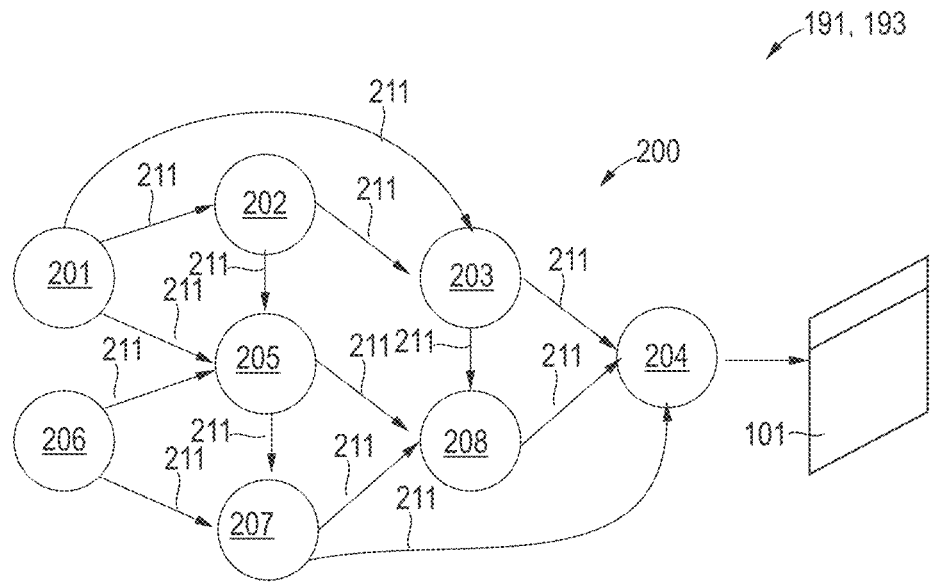
FIG. 9 Structure-based algorithm
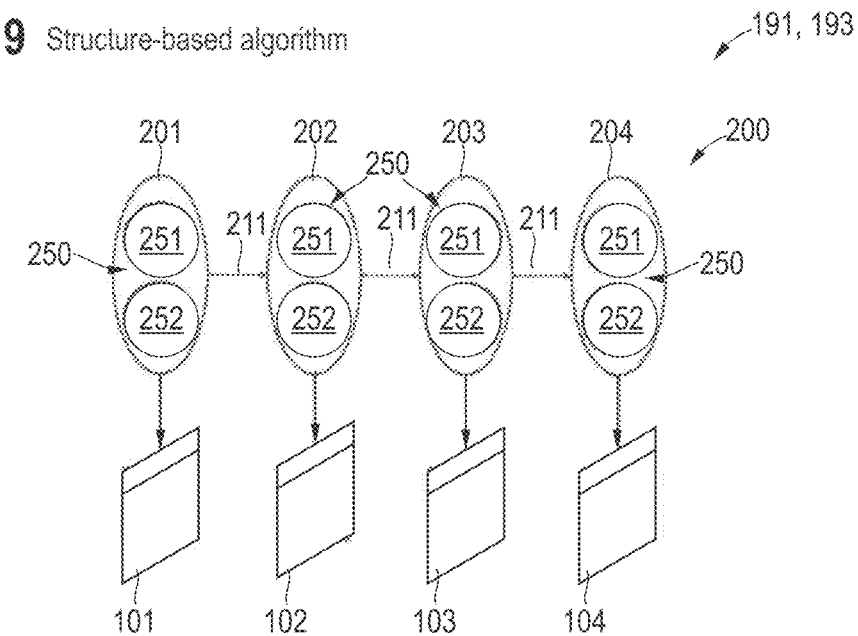

FIG. 10 Hallucinating a probability of 3-D image datasets
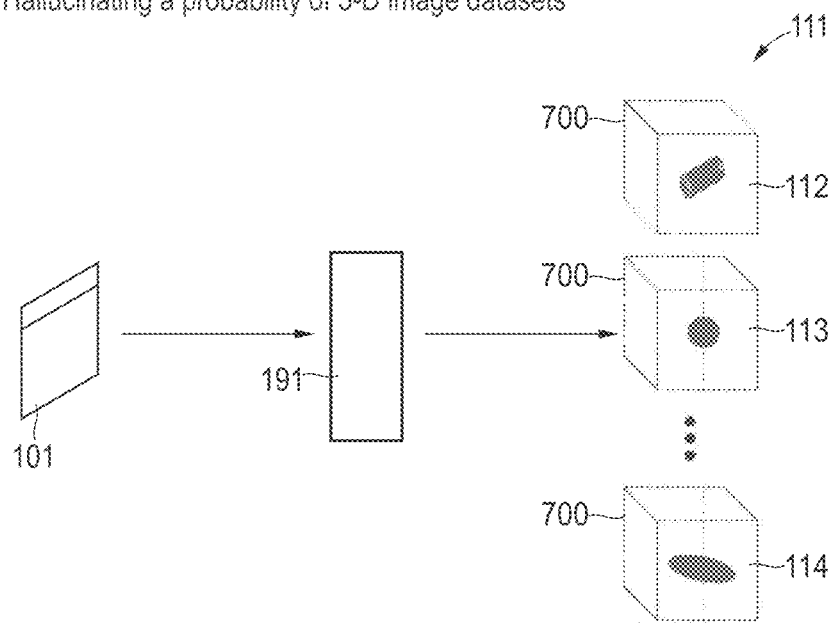
FIG. 11 Localization of a defect in 2-D image dataset
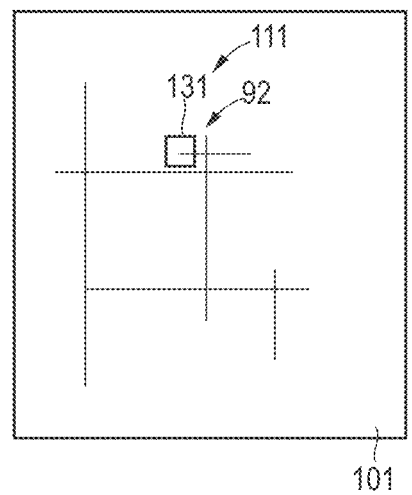

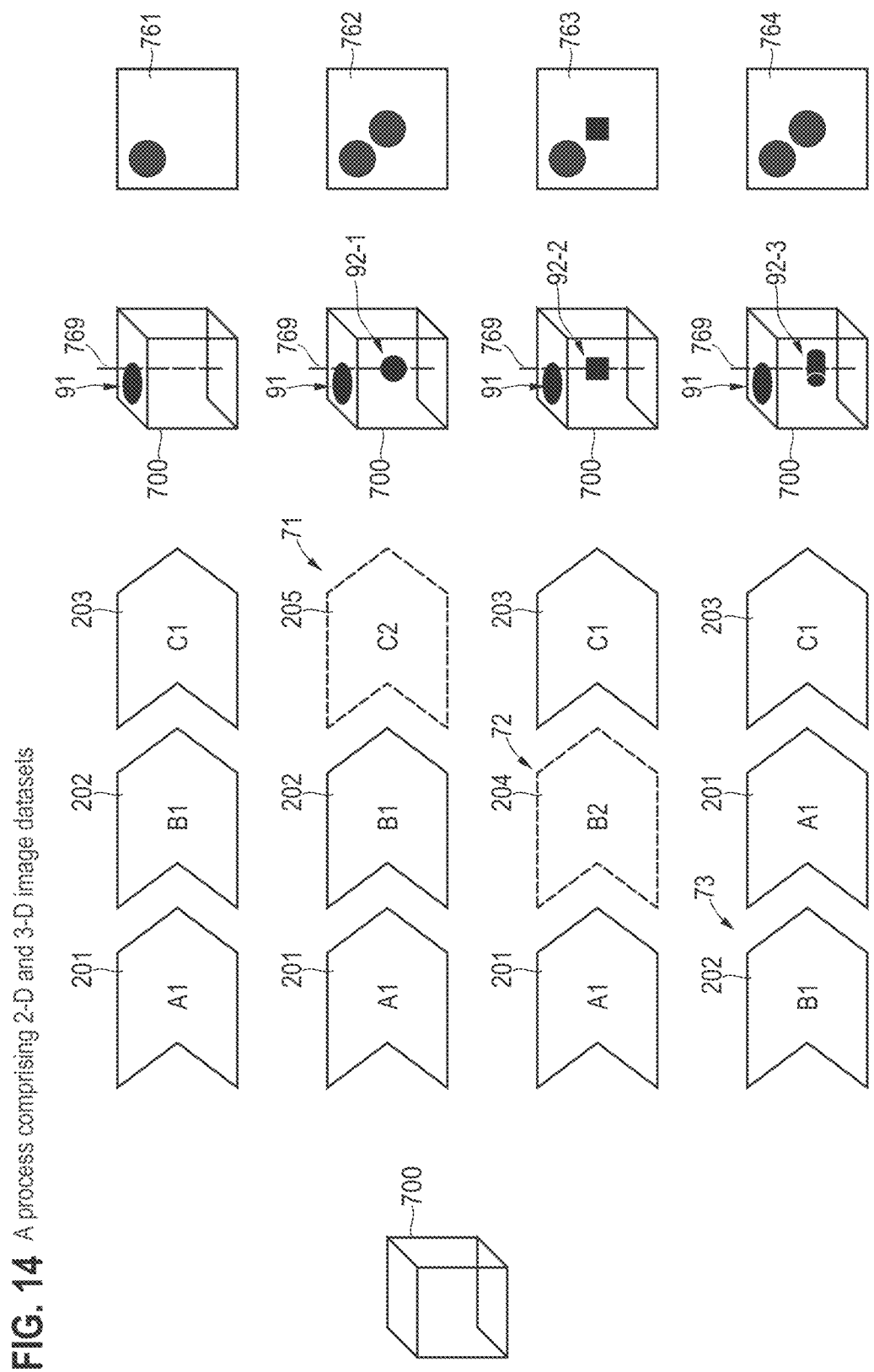
FIG. 14 A process comprising 2-D and 3-D image datasets

FIG. 15 A graph of Figure 14 process
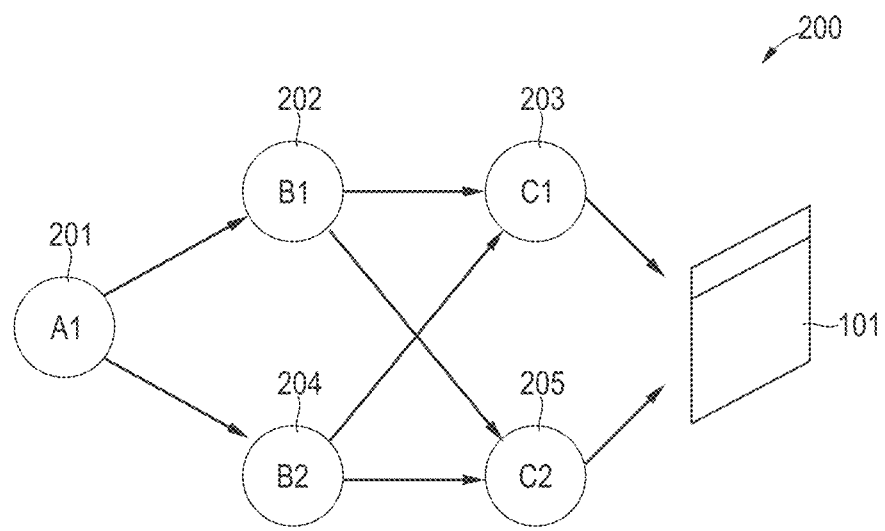

FIG. 16  A decision tree graph of a structure-free machine learning algorithm
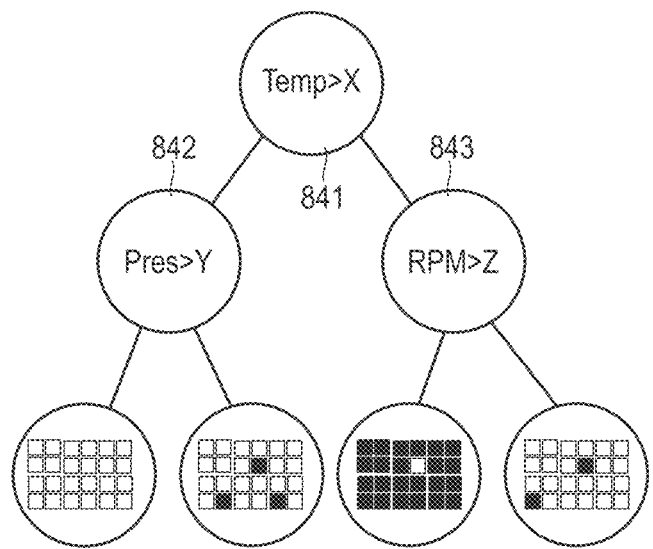
FIG. 17  A decision tree graph of a structure-free machine learning algorithm
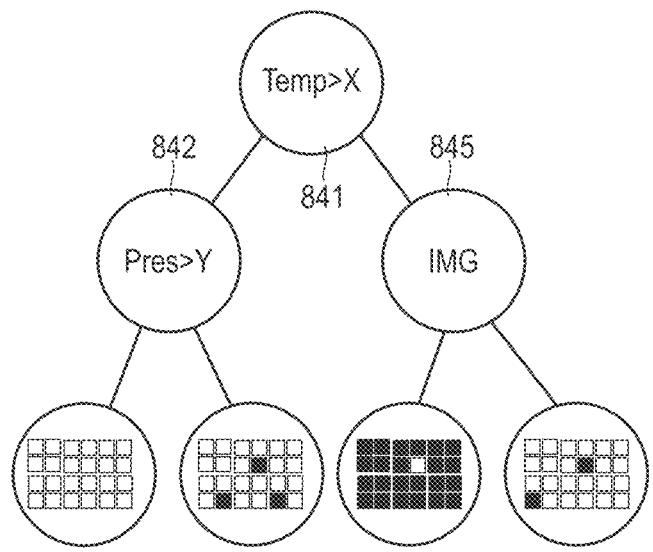

FIG. 18 Hallucinating 3-D image datasets from a 2-D image dataset
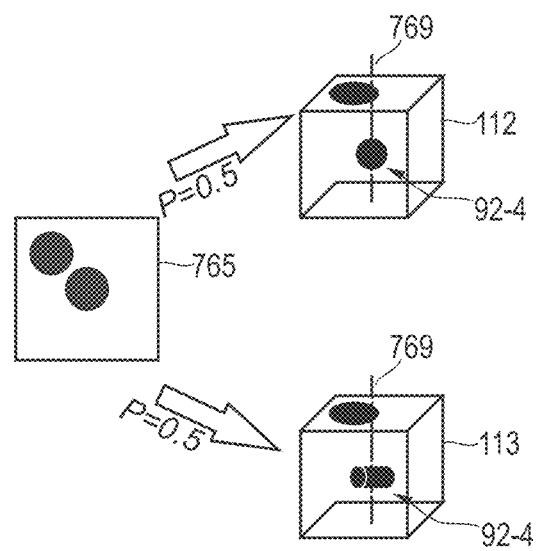
FIG. 19 Hallucinating 3-D image datasets from a 2-D image dataset
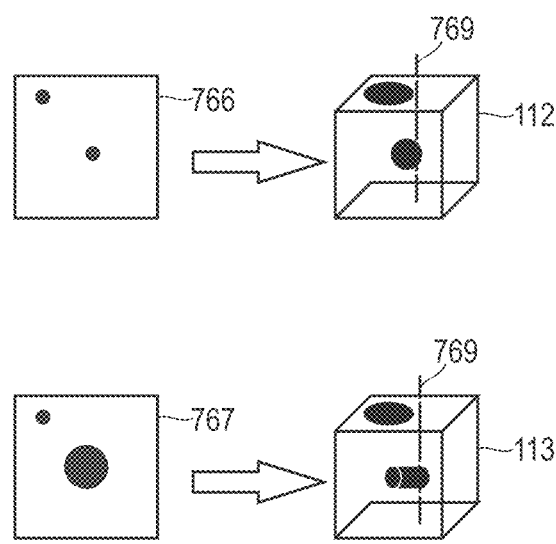

FIG. 20 Hallucinating 3-D image datasets from a 2-D image dataset
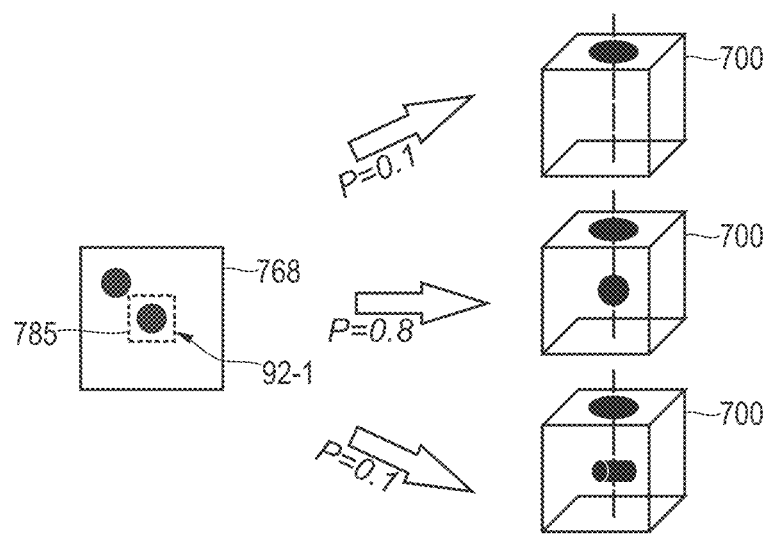

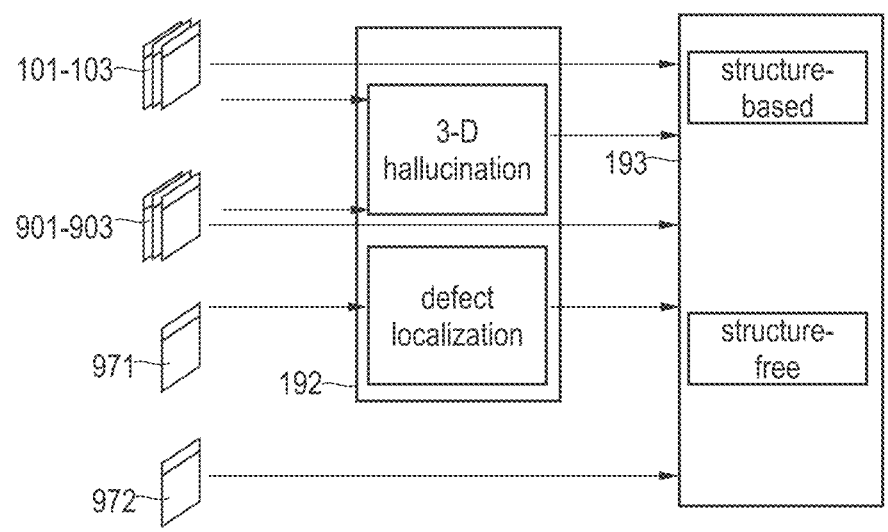
FIG. 21 Aspects relating to training one or more machine-learning algorithms

AUTOMATED ROOT CAUSE ANALYSIS FOR DEFECT DETECTION DURING FABRICATION PROCESSES OF SEMICONDUCTOR STRUCTURES

CROSS-REFERENCE TO RELATED APPLICATION

This application claims priority under 35 USC 119(e) to U.S. Provisional Application No. 62/908,822, filed Oct. 1, 2019. The contents of this application is hereby incorporated by reference in its entirety.

TECHNICAL FIELD

Various examples generally relate to defect detection of defects of semiconductor structures formed on a wafer. Various examples more specifically relate to determining one or more process deviations of a wafer run from a predefined fabrication process as a root cause of the one or more defects.

BACKGROUND

Semiconductor devices are present in semiconductor wafers, e.g., silicon wafers, gallium arsenide wafers, or other wafers. Examples of semiconductor devices include: electrical traces; resistances; transistors, e.g., field-effects transistors or bipolar transistors; trenches; and vias.

The associated fabrication process of semiconductor devices typically includes a large number of processing steps of the wafer. Typical processing steps include: lithography and spin coating of resist.

Due to the large count of process steps, as well as the different types of process steps involved during a wafer run, defects can occur. Defects degrade the operability of the semiconductor devices. Defects can quickly lead to significant reductions of the yield. Thus, it can be generally desirable to analyze defects of semiconductor structures observed during the fabrication process. Such analysis can generally include a classification, and/or a characterization, and/or identification of a root cause. The root cause can correspond to one or more process deviations of the wafer run from the predefined fabrication process.

According to reference implementations, such identification of the root cause can include inspection of 2-D image datasets acquired during the wafer run. For example, optical microscopy or scanning electron microscopy can be employed to acquire the 2-D image dataset.

However, it has been observed that analyzing the 2-D image dataset to identify the root cause of a defect can often be inaccurate. Also, expert knowledge and manual classification of defects can be involved. This can be time-consuming and error prone.

SUMMARY

Therefore, it would be desirable to provide techniques facilitating identification of a root cause of one or more defects observed in 2-D image datasets of semiconductor structures, while overcoming or mitigating at least some of the drawbacks associated with some known approaches. This disclosure seeks to provide such desirable techniques.

In a general aspect, the disclosure provides a method that includes obtaining at least one 2-D image dataset of semiconductor structures formed on a wafer including one or more defects, during a wafer run of the wafer using a predefined fabrication process. The method also includes, based on at least one machine-learning algorithm trained on prior knowledge on the fabrication process and based on the at least one 2-D image dataset, determining one or more process deviations of the wafer run from the predefined fabrication process as a root cause of the one or more defects, based on the at least one 2-D image dataset.

In a general aspect, the disclosure provides a computer program or a computer-program product or a computer-readable storage medium that includes program code. The program code can be executed by at least one processor. Executing the program code causes the at least one processor to perform a method. The method includes obtaining at least one 2-D image dataset of semiconductor structures formed on a wafer including one or more defects, during a wafer run of the wafer using a predefined fabrication process. The method also includes, based on at least one machine-learning algorithm trained on prior knowledge on the fabrication process and based on the at least one 2-D image dataset, determining one or more process deviations of the wafer run from the predefined fabrication process as a root cause of the one or more defects, based on the at least one 2-D image dataset.

In a general aspect, the disclosure provides a device that includes control circuitry configured to: during a wafer run of a wafer using a predefined fabrication process, obtain at least one 2-D image dataset of semiconductor structures formed on the wafer including one or more defects; and based on at least one machine-learning algorithm trained on prior knowledge on the fabrication process and based on the at least one 2-D image dataset, determine one or more process deviations of the wafer run from the predefined fabrication process as a root cause of the one or more defects, based on the at least one 2-D image dataset.

It is to be understood that the features mentioned above and those yet to be explained below may be used not only in the respective combinations indicated, but also in other combinations or in isolation without departing from the scope of the disclosure.

BRIEF DESCRIPTION OF THE DRAWINGS

FIG. 1 schematically illustrates aspects with respect to a wafer according to various examples, wherein semiconductor devices are formed on the wafer.

FIG. 2 schematically illustrates an inter-relationship between defects and root causes according to various examples.

FIG. 4 is a flowchart of a method according to various examples, wherein FIG. 4 illustrates details with respect to the development phase including the training of a machine-learning (ML) algorithm based on prior knowledge.

FIG. 5 is a flowchart of a method according to various examples, wherein FIG. 5 illustrates details with respect to a production phase in which a wafer run is performed and one or more 2-D image datasets are obtained for one or more process steps of the wafer run.

FIG. 6 schematically illustrates an algorithm receiving, as inputs, multiple 2-D image datasets and which outputs a target variable as a root cause for one or more defects of semiconductor structures in the 2-D image datasets, according to various examples.

FIG. 7 schematically illustrates multiple algorithms used to identify a root cause as target variable, wherein a first algorithm hallucinates 3-D image datasets based on 2-D image datasets according to various examples.

FIG. 8 schematically illustrates a structure-based algorithm according to various examples.

FIG. 9 schematically illustrates a structure-based algorithm according to various examples.

FIG. 10 schematically illustrates hallucinating a probability distribution of 3-D image datasets according to various examples.

FIG. 11 schematically illustrates a localization of a defect in a 2-D image dataset according to various examples.

FIG. 14 schematically illustrates a process comprising multiple process steps and associated 2-D image datasets and 3-D image datasets according to various examples.

FIG. 15 schematically illustrates a graph of the process of FIG. 14 according to various examples.

FIG. 16 schematically illustrates a decision tree graph of a structure-free machine learning algorithm according to various examples.

FIG. 17 schematically illustrates a decision tree graph of a structure-free machine learning algorithm according to various examples.

FIG. 18 schematically illustrates hallucinating 3-D image datasets from a 2-D image dataset according to various examples.

FIG. 19 schematically illustrates hallucinating 3-D image datasets from a 2-D image dataset according to various examples.

FIG. 20 schematically illustrates hallucinating 3-D image datasets from a 2-D image dataset according to various examples.

FIG. 21 schematically illustrates aspects with respect to training one or more ML algorithms.

DETAILED DESCRIPTION OF EMBODIMENTS

Figure 3:
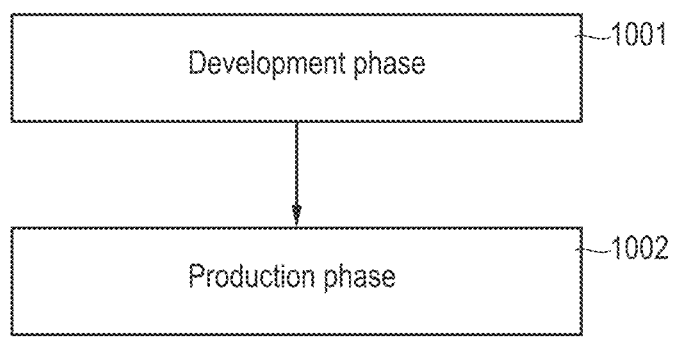
FIG. 3 is a flowchart of a method according to various examples, wherein FIG. 3 schematically illustrates a development phase and a production phase according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of defect detection of defects in semiconductor structures formed on a wafer are described. The techniques described herein facilitate online detection of the defects, i.e., during a wafer run. This means that the defects can be detected based on measurement or inspection data that is acquired during the wafer run that uses a predefined fabrication process. The wafer run can be a high-throughput wafer run for series production. Thus, the wafer run can be implemented in a production phase; distinct from a so-called development phase. In particular, the techniques described herein facilitate defect detection at a speed that does not limit the throughput of the wafer run. The measurements taken to facilitate the defect detection—e.g., acquisition of 2-D image datasets, etc.—typically comply with the desired throughput of the wafer run, e.g., in a volume production context. In other words: the wafer run may not be designed to test for defects, e.g., at a low throughput rate. Rather, the throughput of the wafer run can, on the other hand, be limited by the time involved to implement process steps of the predefined fabrication process.

Various techniques described herein rely on 2-D image datasets. For example, at least one 2-D image dataset can be obtained. The 2-D image dataset can be acquired using an imaging device during the wafer run. The 2-D image dataset can depict semiconductor structures formed on the wafer subject to the wafer run. The semiconductor structures or generally the wafer can include one or more defects.

The imaging device could implement a one-shot imaging modality/technique. An example would be optical microscopy. The imaging device could implement a non-invasive imaging technique; such non-invasive imaging techniques do not degrade or otherwise influence the quality of the semiconductor structures on the wafer. For example, the imaging device could be a scanning electron microscope. As will be appreciated, various imaging modalities may be used by the techniques described herein.

As a general rule, one or more 2-D image datasets may be obtained during the wafer run. For example, multiple 2-D image datasets may be obtained at different process steps along the wafer run. It would also be possible that multiple 2-D image datasets are acquired at the same process step during the wafer run. For example, complementary imaging modalities—e.g., optical microscopy and scanning electron microscopy—may be used to implement the 2-D image datasets at a given process step of the wafer run.

Various techniques are based on the finding that acquisition of 2-D image datasets can provide certain benefits over 3-D image datasets. While 3-D image datasets often provide more information that can be helpful in the defect detection and, furthermore, in the analysis of defects, it has been found that the acquisition time involved for acquiring the 3-D image datasets can be comparably long. In particular, this could limit the throughput of the wafer run. Also, it would sometimes be possible to only acquire 3-D image datasets of a subfraction of all wafers or only a certain inspection region of a wafer. Still further, 3-D image datasets can often be acquired using invasive imaging techniques, e.g., focused ion beam preparation in combination with scanning electron microscopy. Then, the inspected semiconductor structures are destroyed.

According to various examples, it is possible to analyze at least one 2-D image dataset obtained during the wafer run, the at least one 2-D image dataset imaging semiconductor structures formed on the wafer. In particular, the analysis can be used to identify a root cause of one or more defects of the semiconductor structures. The root cause can be associated with one or more process deviations of the wafer run from the predefined fabrication process. Also, the analysis could be generally for characterization and/or classification of the defects.

According to various examples, a ML algorithm is used to determine the one or more process deviations. The ML algorithm can be trained on prior knowledge on the fabrication process. Further, the one or more process deviations are determined based on the at least one 2-D image dataset. For example, the ML algorithm could receive the at least one 2-D image dataset as an input. Also intermediate processing on the 2-D image dataset, before feeding the input to the ML algorithm would be possible.

Examples of ML algorithms include, e.g.: support vector machines; random forest; and deep neural network.

In particular, it would be possible that the ML algorithm is trained prior to the wafer run. In particular, the training could be implemented using expert knowledge and/or invasive imaging such as 3-D image datasets of the semiconductor structures. The ML algorithm can also be trained based on 2-D image datasets, in alternative or in addition to the 3-D image datasets.

Various examples are based on the finding that desired throughput in the development phase are significantly lower than during the wafer run itself, in the production phase. Therefore, the additional use of 3-D image datasets in the training phase can help to significantly enhance the performance of the ML algorithm used to identify the root cause of the one or more defects during the production phase. In particular, a better performance if compared to scenarios that operates solely on the 2-D image datasets obtained during the wafer run in the production phase can be accomplished where training in the development phase is also used.

In the various examples described herein, information is classified into observed variables, hidden variables, auxiliary variables, and target variables.

Observed variables constitute information that is accessible in the manufacturing or test environment during the wafer run in the production phase, i.e., the at least one image dataset.

On the other hand, hidden variables are information that are not accessible during the wafer run in the production phase.

Target variables to be deduced from observed variables. Typically, these target variables provide actionable insights, e.g., defect root cause or process indicators, their locations and types.

Auxiliary variables are hidden variables that have no immediate merit, but serve as an intermediate representation for deducing target variables. As an example, the target variables could correspond to 3-D image datasets.

In this regards, various techniques described herein can use an algorithm that maps observed variables to hidden variables, optionally with the support of auxiliary variables. Typically, the algorithm comprises numerous parameters which are either fixed through expert knowledge (traditional approach) or automatically, through ML. The training of an ML algorithm inputs valid pairs of observed—target variables (ground truth) and learns the algorithm which is optimized to map observed variables to associated target variables. The algorithm might optionally depend on auxiliary variables, which are in-turn deduced from dedicated further algorithms, e.g., ML algorithms.

The trained one or more algorithms deployed in the manufacturing environment operate in the production phase. The inputs are previously unseen observed variables which are used to infer (optional) auxiliary variables. These are collectively used to infer target variables using the trained ML algorithm. The output may be a probability distribution over multiple target variables that are responsible for the given observation. Typically, the output is a list of probable process parameters that are associated with the at least one input 2-D image dataset. In other words, if the input 2-D image dataset were in-fact defective, the output is a list of irregularities in the manufacturing process that might have resulted in the observed defect. This corresponds to a root-cause analysis (RCA).

FIG. 1 schematically illustrates aspects with respect to a wafer 90. The wafer 90 can be made from, e.g., silicon, silicon on insulator, gallium arsenide, indium gallium arsenide, or another semiconductor or compound semiconductor material.

An array of semiconductor structures 91 is formed on the wafer 90, using a fabrication process. In a production phase, a wafer run corresponds to the handling of the wafer with respect to various fabrication process steps of the fabrication process. Such fabrication process steps can include in the various examples described herein: lithography, resist coating, thermal annealing, cleaning, exposure, development, lift off, material deposition, etching such as dry etching, wet etching, chemical etching, or physical etching, grinding, polishing, etc.

Illustrated in FIG. 1 is a scenario in which some of the semiconductor structures 91 include defects 92. To give just a few examples of defects: electrical shortcuts, electrical interruptions, contamination by particles, uneven surfaces, edge protrusions, inhomogeneous thin layers, etc.

As a general rule, such a defect 92 can have various reasons. In particular, one or more process deviations of the wafer run from the predefined fabrication process can correspond to a root cause of the one or more defects 92. The art of identifying the root cause is often referred to as RCA. FIG. 2 illustrates details with respect to RCA.

FIG. 2 schematically illustrates aspects with respect to the RCA. In FIG. 2, a defect 92, here electrical short between 2 electrical connections, is broken down into possible causes 82-86. More specifically, FIG. 2 illustrates a root cause tree in which the causes of the defect 92 are hierarchically broken down to finer and finer levels. The use of three level hierarchies, as in FIG. 2, is an example only.

In FIG. 2, the defect 92 can be observed using a 2-D image dataset. A respective observed variable may be defined accordingly.

For instance, an electrical short between two electrical connections—the example defect 92 in FIG. 2—may stem from a cause associated with failure during the lift off process, i.e., the resist may not be fully removed, etc. See box 82. An alternative cause for the defect 92 may be a poor cleaning, as illustrated by box 83. There can be other causes.

Then, the cause associated with box 82, i.e., lift-off failure, can be further broken down to, e.g.: overexposure according to box 84, resist overtemperature according to box 85, or deposition rate deviation according to box 86. Boxes 84-86 describe deviations from the fabrication process on the finest available level and, thus, correspond to root causes. Boxes 84-86 can thus correspond to target variables.

FIG. 3 is a flowchart of a method according to various examples. The method of FIG. 3 schematically illustrates different phases associated with the production of semiconductor structures.

First, there is a development phase 1001; secondly, there is a production phase 1002.

During the development phase 1001, it would be possible to, firstly, acquire 3-D image datasets of a test wafer run. During the development phase 1001, the desired throughput may be relaxed. In particular, the throughput of the test wafer runs can be limited by the acquisition of 3-D image datasets and the associated increased imaging time duration.

During the development phase, it would also be possible to train an ML algorithm using at least one of expert knowledge or the invasive imaging such as the 3-D imaging datasets.

During the production phase 1002, multiple wafer runs using a predefined fabrication process may be implemented. During the production phase, one or more 2-D image datasets may be acquired. It may not be required to acquire 3-D image datasets during the production phase 1002, or employ other invasive imaging.

The throughput of wafers 90 in the development phase 1001 may be lower than the throughput of wafers 90 in the production phase. In the production phase 1002, the throughput may be limited by the operating speed of the wafer-handling equipment, e.g., spin coater, etching device, etc. Differently, in the development phase 1001, the acquisition of, e.g., 3-D image datasets may limit the handling speed.

Figure 4:
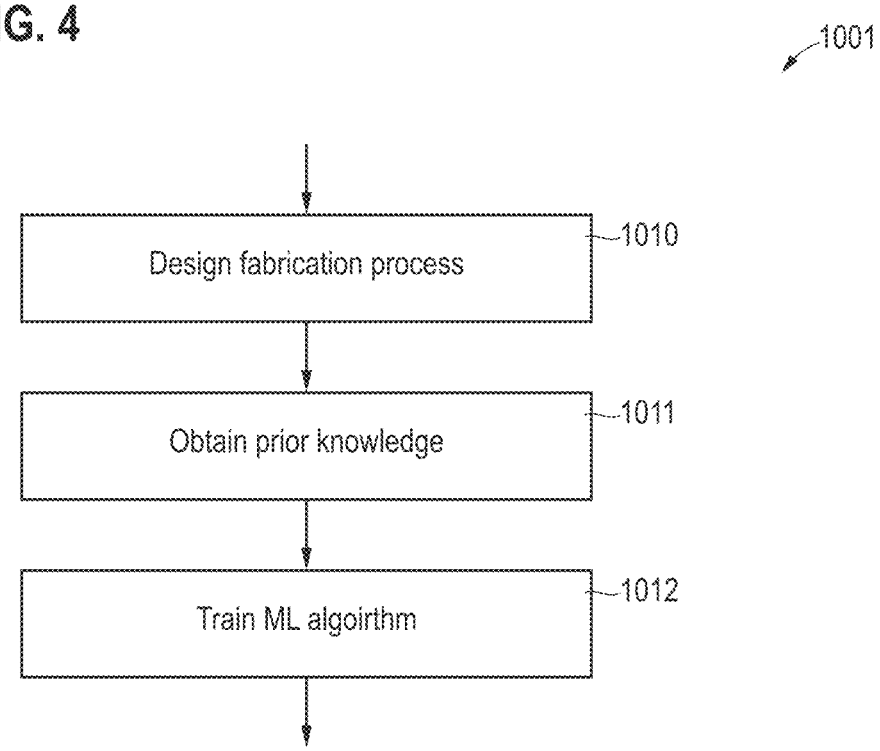

FIG. 4 is a flowchart of a method according to various examples. FIG. 4 illustrates aspects with respect to the development phase 1001.

At block 1010, the fabrication process is defined. This can include definition of the various operational parameters of the processing tools, e.g., definition of photoresist to be used, thickness of photoresist, spin-speed of spin coater, handling temperatures, etch rates, material deposition rates, etch processes to be used, sequence of process steps, etc.

At block 1011 prior knowledge is obtained. For example, one or more 3-D image datasets can be obtained. The 3-D image datasets can be indicative of semiconductor structures formed on the wafer including one or more defects. Block 1011 can include one or more invasive imaging techniques, e.g., focused ion beam—scanning electron microscopy in a cross-beam setup. 3-D image datasets can be acquired. Prior knowledge can also include labeling of 3-D image datasets using expert knowledge.

Obtaining prior knowledge at block 1011 can facilitate training a ML algorithm at block 1012. Here, conventional training techniques such as back propagation, labeling, etc. can be employed. The ML algorithm that has been trained in block 1012 can then be employed during the production phase 1002.

Figure 5:
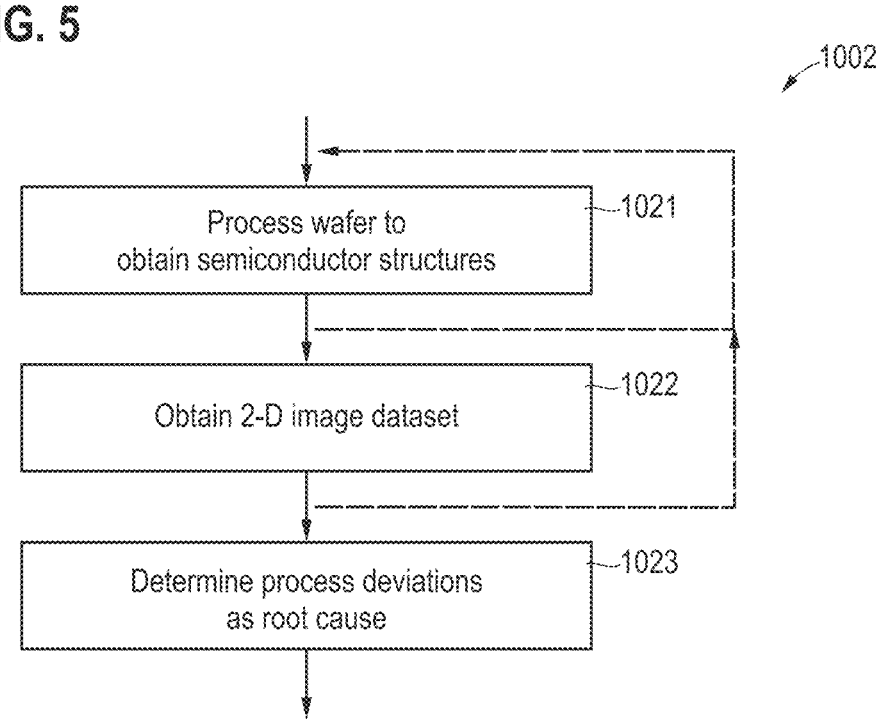

FIG. 5 is a flowchart of a method according to various examples. The method of FIG. 5 illustrates aspects with respect to the production phase 1002.

At block 1021 and 1022, a wafer run is executed. This includes processing the wafer 90 to obtain multiple semiconductor structures 91 formed on the wafer. The wafer run is in accordance with the fabrication process defined at block 1010 (cf. FIG. 4). The semiconductor structures 91 can generally include one or more defects 92. A yield rate of the fabrication process may be below 100%.

More specifically, at block 1021, one or more process steps of the fabrication process are executed. The wafer 90 is processed and handled accordingly.

At block 1022, one or more 2-D image datasets are obtained. Block 1022 can include receiving the one or more 2-D image datasets via a communication interface; and/or acquiring the at least one 2-D image dataset. For example, optical microscopy and/or scanning electron microscopy may be performed as part of block 1022. Other imaging techniques are possible; in particular, non-invasive imaging techniques.

Blocks 1021, 1022 can be re-executed for multiple process steps of the predefined fabrication process. As a general rule, it is not required to obtain one or more 2-D image datasets for each iteration of block 1021, i.e., for each process step. Rather, it would be possible that one or more 2-D image datasets are only obtained for one or some of all process steps of the predefined fabrication process.

Then, at block 1023, an RCA is performed. In particular, one or more process deviations from the wafer run— implemented by the multiple iterations of block 1021—from the predefined production process are determined, as a root cause of the one or more defects of the semiconductor structures.

In block 1023 an algorithm is employed. In particular, a ML algorithm is employed, wherein the ML algorithm can be trained during the development phase, i.e., at block 1012 (cf. FIG. 4).

As a general rule, various options are available for implementing block 1023. Some of these options are explained in connection with the following FIGS.

FIG. 6 schematically illustrates aspects with respect to an ML algorithm 191.

In the example of FIG. 6, multiple observed variables implemented by 2-D image datasets 101-103 are provided as an input to the ML algorithm 191. The ML algorithm 191 provides, as an output, an indication of one or more process deviations, i.e., a target variable 121. The target variable 121 corresponds to one or more root causes, e.g., process deviations 84-86.

FIG. 6 corresponds to a one-layer architecture of the analyzing of the 2-D image datasets 101-103: There is only the ML algorithm 191 involved. In other examples, more than a single algorithm may be employed and it would be possible to use a multi-layer architecture of the analyzing, i.e., multiple stacked algorithms. Such a scenario is explained in connection with FIG. 7.

FIG. 7 schematically illustrates aspects with respect to multiple algorithms 192-193. In the example of FIG. 7, the algorithm 192, e.g., a ML algorithm, receives the 2-D image datasets 102-103, corresponding to observed variables, as input and determines a hidden variable 111. The 3-D image dataset corresponds to the hidden variable 111: this is because the 3-D image dataset cannot be directly observed (no 3-D imaging tool used during the production phase 1002).

The hidden variable 111 is associated with the one or more defects as imaged by the 2-D image datasets 101-103.

A further algorithm 193 then receives the 3-D image dataset of the hidden variable 111 as an input.

As a general rule, various options are available for implementing the at least one hidden variable 111. For instance, it would be possible that the at least one hidden variable 111 includes a 3-D image dataset or a probability distribution of 3-D image datasets, the 3-D image dataset or the probability distribution of 3-D image datasets imaging the one or more defects 92. Alternatively or additionally, the at least one hidden variable 111 could include a localization of the one or more defects 92. This means that a bounding box or other spatially resolved label could be provided, e.g., in the 2-D image datasets 101-103 or a 3-D image dataset. Alternatively or additionally, the at least one hidden variable 111 includes a classification of the one or more defects 92. The classification can be associated with a selection of one or more classes from a set of candidate classes. The set of candidate classes may be predefined.

As a general rule, it would be possible that the further algorithm 193 is also a ML algorithm trained on the prior knowledge of the fabrication process, e.g., during the development phase 1001 (cf. FIG. 4). Alternatively or additionally, it would be possible that the further algorithm 193 is analytically defined and operates based on prior knowledge of interdependencies between multiple process parameters of the predefined fabrication process. This would corresponds to a so-called structure-based algorithm.

As a general rule, various options are available for the algorithm 191, 193 providing the target variable 121. Next, a few examples in connection with the algorithm 191, 193 that provides the target variable 121 are explained. In particular, example implementations of the algorithm are described.

In a first example implementation, a structure-based algorithm is provided. Such techniques are based on the finding that ensuring the outcomes of the algorithm 191, 193—i.e., the target variable 121—to be valid for various underlying fabrication processes is a challenging task. This is because multiple deviations from the predefined fabrication process can result in the same observed variables, i.e., the same 2-D image datasets 101-103. Therefore, it can be helpful to assimilate prior knowledge about the interdependencies of process steps within the algorithm 191, 193. In one embodiment of an ML algorithm, such information is incorporated in generative models where joint probability distributions of process parameters and observed variables are learned. In other words, it is possible to infer probable (valid) sequences of process parameters that might have resulted in a given observed variable such as the 2-D image datasets 101-103.

A second example implementation relates to structure-free algorithms. Here, the idea is to learn conditional probabilities of target variables 121 given the observed variables such as the 2-D image datasets 101-103. These have advantages of being powerful and robust that can also operate in limited training data regimes, e.g., support vector machines, random forests and deep neural networks. Hence, according to this second example implementation, an ML algorithm can be used.

A third example implementation relates to hallucinating 3-D image datasets as hidden variable 111 or auxiliary variable. Recognizing that the rich information in 3-D image dataset relaxes an RCA model's dependence on process priors, it is possible to alleviate the limitations of structure-free models by hallucinating 3-D image datasets from observed 2-D image datasets (see FIG. 7, algorithm 193).

A fourth example implementation relates to defect analysis as auxiliary information. Structure-free algorithms could also benefit from information such as defects and their types. As a general rule, obtaining a rich set of valid observed variables, auxiliary variables, and target variables is helpful for training a reliable algorithm that is robust to previously unseen observed variables. Such datasets have traditionally been collected by manually tapping into the manufacturing process and recording relevant ground truth information. Owing to high effort involved, obtaining large datasets with rich variations can be challenging. Alternatively, data can also be obtained via simulation. Here, the challenge lies in capturing the real-world scenario pertaining to test environment.

Next, details with respect to the various options for implementing the algorithm 191 or the algorithm 193 are discussed in connection with FIG. 8, FIG. 9, FIG. 10, FIG. 11 and FIG. 12.

FIG. 8 schematically illustrates aspects with respect to an example implementation of the algorithms 191 or 193. More specifically, FIG. 8 schematically illustrates aspects with respect to a structure-based algorithm. In the example of FIG. 8, the algorithm 191, 193 operates based on prior knowledge on the interdependencies 211 between multiple process parameters 201-208 associated with various process steps of the predefined fabrication process. In particular, in the scenario of FIG. 8, the multiple process parameters 201-208 are modeled using nodes of a graph 200. The interdependencies 211, on the other hand, are modeled using the edges between the nodes of the graph 200.

Such techniques are based on the finding that using generative models, fabrication processes can be represented using graphs 200 where nodes (round circles in FIG. 8) represent production steps as stochastic variables and edges represent the dependencies between variables (production steps). Further, the direction of edges represents the temporal order of various process steps. In FIG. 8, a 2-D image dataset 101 is obtained that images the semiconductor structures after the process step associated with the process parameter 204. The output of the algorithm 191, 193 is the probability of an internal process state (captured in the hidden variables P0, . . . , P7 associated by the process parameters 201-208) given the observed variables, e.g. p(P0-P2-P5-P6-P7|OV). The case where the observed variable OV is a single 2-D image dataset is represented in FIG. 8. Junction tree analysis [David Barber, Bayesian Reasoning and Machine Learning, Cambridge University Press, 2012] is an established algorithm to perform the inference. Due to the fact that a single variable (the 2-D image) is observed this modeling is challenging and may result in ambiguities for the inferred internal process states.

FIG. 9 schematically illustrates aspects with respect to the algorithms 191, 193. Also in the scenario of FIG. 9, a graph 200 including edges and nodes is used. Again, different process parameters 201-204 are modeled using different nodes of the graph 200; the interdependencies 211 are illustrated. In the scenario of FIG. 9, multiple 2-D image datasets 101-104 are obtained as observed variables, the 2-D image datasets 101-104 imaging the semiconductor structures for different process parameters 201-204. The scenario FIG. 9 refers to a scenario in which observed variables for each process step of the predefined fabrication process are available. In the scenario of FIG. 9, each process parameter 201-204 includes a hidden variable 250 that can take the state normal 251 or the state abnormal 252. During the production phase 1002, it is desired to uncover the sequence of hidden variables 250 to perform the RCA. For example, a selection between the states 251-252 can be chosen for each hidden variable 250 for each process parameter 201-204 that best explains the observed variables, i.e., the 2-D image datasets 101-104. For example, algorithms 191, 193 according to references can be used, e.g., a Baum-Welch algorithm, see David Barber, Bayesian reasoning and machine learning. Cambridge University Press, 2012. The most probable sequence of the states 251-252 is obtained through Viterbi decoding. The states 251-252 in the set-up can indicate if single process parameters 201-204 of the predefined fabrication process have likely seen failures or have been successfully performed, i.e., whether deviations for each one of the process parameters 201-204 exist.

The graph 200 illustrated in FIG. 9 is an example only. For example, skip connections to model higher-order dependencies of the process parameters 201-204 would be possible.

While in the examples of FIGS. 8 and 9 structure-based algorithms have been described, it is not required in all scenarios to provide prior knowledge on the structure of the predefined fabrication process. For example, discriminative models could be leveraged to form structure-free algorithms. An ML algorithm can be used. In this example, the training data can comprise corresponding pairs of observed variables—e.g., 2-D image datasets—and process-parameters. This is used to optimize free parameters of discriminative models such as SVM, random forests or deep neural networks. During the production phase 1002, the algorithm 191, 193 infers the most probable internal process state that corresponds to the observed variables (process parameters), i.e. $p_{max}(P|OV)$ where P is a sequence of process states $P_1$, $P_2, \ldots, P_N$ and OV is a sequence of observed variables. Methods for introspection of discriminative models can be used to gain insights on the process by pointing to the observed variables that had the largest impact with respect to the probability estimate. 3-D image datasets can be valuable for relaxing the need for precise information on the fabrication process for the algorithm. Therefore, such information serves as useful auxiliary information for structure-free models. In this regard, while 2-D image dataset and corresponding 3-D image dataset are observed during the development phase 1001, typically only 2-D image datasets are observed during the production phase 1002. Therefore, a 3-D image dataset or a probability distribution that might have resulted in the observed 2-D image dataset needs to be inferred. This can be solved as a regression problem that maps images from 2-D to 3-D, e.g., using support vector regression, random forests or deep neural networks. The respective ML algorithm 192 is illustrated in FIG. 7. Alternatively, a distribution of 3-D images can also be obtained through Generative Adversarial Networks (GANs) which learns statistical correlations between image manifolds of 2-D and 3-D manifolds.

FIG. 10 illustrates such hallucinating of 3-D image datasets 112-114 as a hidden variable 111 from an observed 2-D image dataset 101. The input is the 2-D image dataset 101, possibly with a defect 92. The output of the image hallucination algorithm 192 is the hidden variable 111 in the form of a probability distribution over 3-D image datasets 112-114. The 3-D image datasets 112-114 describe the scenario that might have resulted in the observed 2-D image dataset 101. The 3-D image datasets 112-114 can correspond to 3-D structural models of the defect 92. Each 3-D image dataset 112-114 corresponds to a different defect type, thereby aiding the RCA. Accumulating the output of RCA for each 3-D image dataset, a probability distribution p(P|OV) can be obtained.

An example algorithm 192 for synthesizing the 3-D image datasets 112-114 would be a 3-D Generative Adversarial Network (3D-GAN).

Defect analysis in 2-D image dataset 101 can be another form of useful hidden variable 111 for structure free algorithms 191, 193. In this regard, defect/anomaly detection is performed, e.g., through outlier analysis using, e.g., SVMs or random forest or another ML algorithm. An alternative approach is to employ an autoencoder based on anomaly detection. Here, the model uses defectless samples to learn low-dimensional representations that are capable of reconstructing (defect-free) input data. As a consequence, samples with defects are not perfectly reconstructed, resulting in high error which usually corresponds to defects 92. These are then localized in images and can be sorted into predefined types by a classifier, e.g., SVM, deep neural networks or random forests, or another ML algorithm.

FIG. 11 illustrates such an example localization 131 of a defect 92, e.g., a shortcut between electrical traces. In FIG. 11, the localization 131 is implemented in a 2-D image dataset 101 as observed variable, but, generally, could also be implemented in a hallucinated 3-D image dataset 112-114, e.g., of a corresponding probability distribution obtained from the algorithm 192. The localization 131 implements a possible hidden variable 111.

Figure 12:
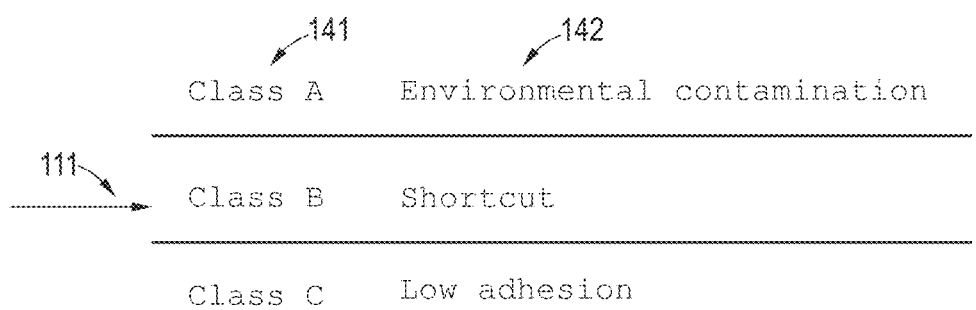
FIG. 12 schematically illustrates a classification of a defect according to various examples.

FIG. 12 illustrates an example classification of a defect, in connection with a 2-D image dataset 101 (albeit a classification would also be possible to be implemented on a 3-D image dataset 112-114 of a corresponding distribution, e.g., generally the output of the algorithm 192 (cf. FIG. 7). The classification can implement another possible hidden variable 111.

In FIG. 12, multiple predefined candidate classes 141 are associated with defect classes 142. A given defect can be associated with a given class, here class B, electrical shortcut.

Figure 13:
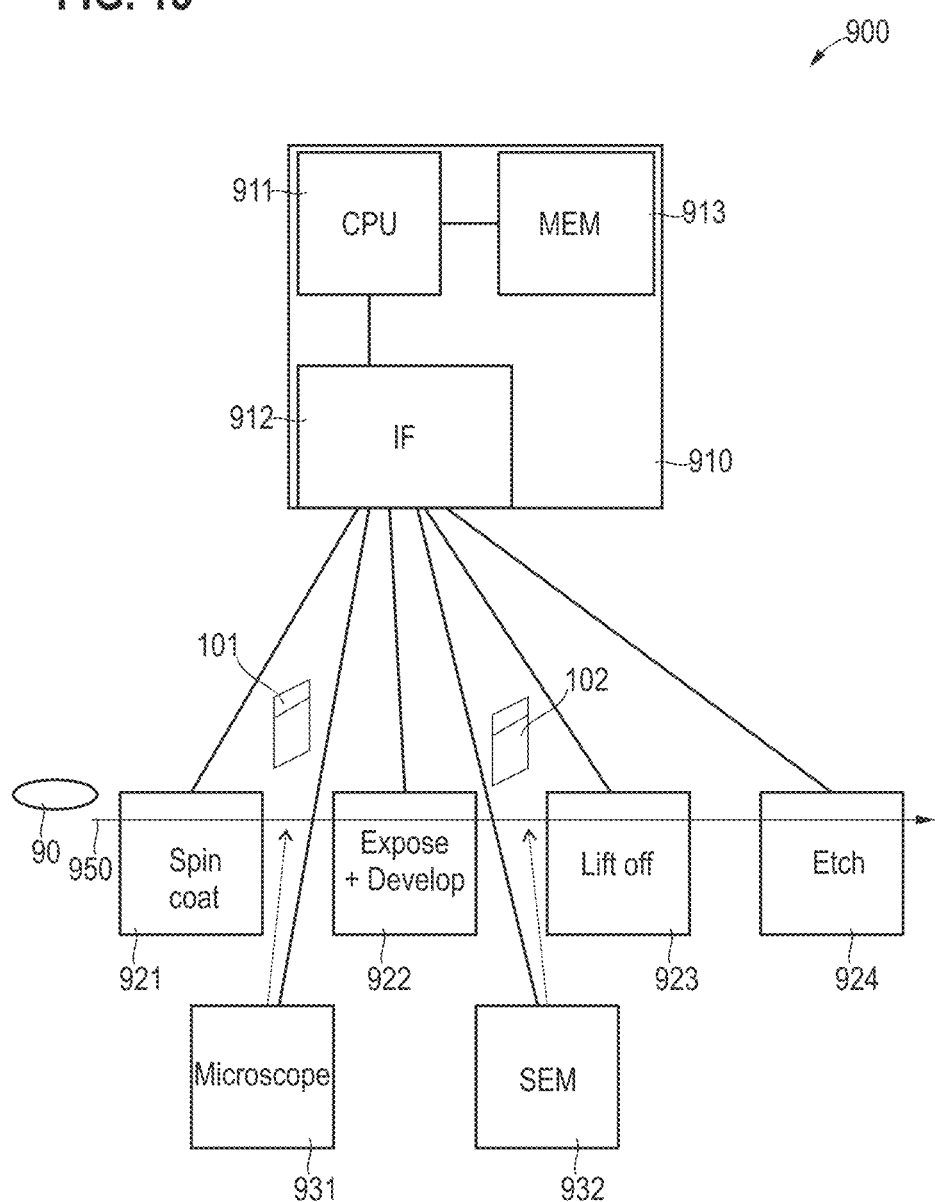
FIG. 13 schematically illustrates a system according to various examples.

FIG. 13 schematically illustrates a system 900 that can be used to implement various of the techniques described herein. The system 900 includes a device 910, e.g., a computer or control equipment. The device 910 includes control circuitry 911, e.g., implemented as a central processing unit (CPU), and/or a graphics processing unit (GPU), and/or a field-programmable array (FPGA), and/or an application-specific integrated circuit (ASIC). Program code can be loaded from a memory 913 and executed by the control circuitry 911. Executing the program code causes the control circuitry 911 to perform techniques as described herein, e.g.: obtaining observed variables such as 2-D image datasets via an interface 912; analyzing the observed variables, e.g., to perform an RCA; determining one or more hidden variables; executing one or more algorithms as part of the analysis, e.g., a ML algorithm or a structure-based algorithm.

As illustrated in FIG. 13, the system 900 can also include or can be connected to production equipment 921-924 to implement the predefined fabrication process. Data transfer between the production equipment can be fully automated, or can be facilitated manually.

In FIG. 13, the wafer 90 is handled to pass by the various production equipment 921-924. One or more process steps of the fabrication process (and along with this, the process parameters 201-208) are implemented by each one of the production equipment 921-924, as part of the wafer run 950. The arrangement of the production equipment 921-924 defines the interdependencies 211. By such a setup, the graph 200 (cf. FIGS. 8 and 9) is defined.

For example, the production equipment 921 implements a spin coater to deposit a resist on the wafer 90. For example, the production equipment 922 exposes and develops the resist. For example, the production equipment 923 implements a lift-off of the resist, in accordance with the exposure and development of the previous process steps. For example, the production step 924 implements an etching.

Also illustrated in FIG. 13 is a scenario in which 2-D image sources 931-932 are included in the system 900. For example, an optical microscope 931 is provided that can take images of the semiconductor structures of the wafer 90 after the spin coating at the spin coat equipment 921. A scanning electron microscope 932 is provided that can take images of the semiconductor structures of the wafer 90 after the exposure and development at the exposure and development equipment 922. Both, the optical microscope 931 and the scanning electron microscope 932 can also be applied after other process steps.

The image sources 931-932 can provide 2-D image datasets 101-102 to the interface 912; and the control circuitry 911 can then process the 2-D image datasets 101-102 using an appropriate algorithm such as a ML algorithm and/or a structure-based algorithm.

Illustrated in FIG. 13 is a scenario in which also the production equipment 921-924 can provide control data to the interface 912 during the wafer run 950. For example, one or more observed variables used as an input in one or more algorithms implemented by the control circuitry 911 to implement the RCA may also be based on such control data. Examples would include: operating parameters of the production equipment 921-924, to better define the process steps (e.g., a ramping speed, maximum speed, spin duration, etc. in connection with the spin coat equipment 921, etc.).

Next, details with respect to the functioning of the system 900 are explained in connection with the following FIGS.

FIG. 14 illustrates aspects with respect to defects 92 and process deviations 71-73. FIG. 14 illustrates a target volume 700 of the wafer 90 that is investigated. The target volume 700 is processed using a fabrication process; the fabrication process includes the process steps 201-203.

In FIG. 14, upper column, all process parameters 201-203 function properly, i.e., there are no abnormalities. A semiconductor structure 91 is formed by the process parameters 201-203 in the target volume 700.

FIG. 14, middle rows illustrate scenarios in which the fabrication process malfunctions. For example, an abnormal process parameter 205 is included in the process, instead of the process parameter 203; this results in a defect 92-1. The abnormal process parameter 204—instead of process parameter 202—results in a defect 92-2.

FIG. 14, lower row illustrates a scenario in which the process parameters 201, 202 are inter-changed in sequence; which results in a defect 92-3. It is assumed that the configuration of FIG. 14, lower row is practically unrealizable which can only theoretically be possible.

FIG. 15 is the associated graph 200 illustrating the process. The graph 200 could be used in a structure-based algorithm (cf. FIG. 8).

The particular sequence of process parameters in FIG. 15 needs to be inferred in the production phase 1002. A direct observation may be possible in the development phase 1001.

Further, process variables (e.g., temperature, pressure, rounds per minute, etc.) can be observed in both phases 1001, 1002.

As illustrated in FIG. 14, the configuration of the process has a characteristic visible effect on the resulting 3-D target volume 700. While an ellipsoid at the volume surface—i.e., implementing the semiconductor structure 91—is common to all configurations of the process, the underlying 3-D geometric defect 92-1, 92-2, 91-3 characterizes the particular configuration of the process (e.g., process parameters 201-202-203, or 201-202-205, or 201-204-203. In other words, there are no defects if the process is defect-free (process parameters 201-202-203), a spherical defect 92-1 if sub-process C fails (process parameters 201-202-205), a cuboidal defect 92-2 if sub-process B fails (process parameters 201-204-203), and a cylindrical defect 92-3 for the practically impossible configuration (process parameters 202-201-203). The respective 3-D target volume 700 can be measured during the development phase 1001, but not in the production phase 1002.

As illustrated in FIG. 14, 2-D image datasets 761-764 are obtained, by imaging the 3-D target volume 700 at the respectively illustrated axes 769. The 2-D image datasets 761-764 have a smaller information content as a 3-D image dataset of the 3-D target volume 700. For example, the entire content of the 3-D target volume 700 may be projected into a single imaging plane such that depth information is lost. Due to such projection, ambiguities can result: a given 2-D image dataset can ambiguously correspond to multiple target volumes 700: e.g., the 2-D image datasets 762, 764 look identical, even different defects 92-1, 92-3 are observed. Further, the 2-D image datasets 761-764 include, both, information on the semiconductor structure 91, as well as on defects 92-1-92-3. The information on the defects 92-1-92-3 can be useful during inference, because observing locally, the circular defects can be classified as those resulting from the sequence of process parameters 201-202-205, e.g., using a structure-based algorithm using the graph 200; note that the graph 200 excludes the process 202-201-203. In other words, such structure-based algorithm can evaluate the best path on the process-graph 200 that illustrates the observed 2-D image dataset, and the solution is a physically realizable process. In other words, given any observed 2-D image dataset 761-764, the structure-based algorithm maps it on to one of the three processes defined by the process parameters: 201-202-203; 201-202-205; or 201-204-203.

It is not required in all scenarios to use a structure-based algorithm. For example, it would also be possible to use a structure-free algorithm. Such discriminative models can efficiently learn conditional probabilities. In this regard, the development phase 1001 may use observed process variables to classify observed 2-D image datasets into pre-defined normal and abnormal images. During the production phase 1002, if a 2-D image dataset were to be classified as abnormal, the process variables of highest impact are inspected to infer the underlying process. As a 2-D image dataset can often be explained by multiple process configurations (i.e., an ambiguity exists, as already explained in connection with FIG. 14), there is a possibility to infer non-plausible processes: For example, in FIG. 14, the 2-D image datasets 762, 764 look alike an the result of the structure-free algorithm could be the process 202-201-203. However, the process 202-201-203 does not make physical sense. A corresponding scenario is illustrated in FIG. 16.

FIG. 16 schematically illustrates a structure-free algorithm for RCA using random forests. FIG. 16 illustrates a decision tree graph 850 in which abnormal 2-D image datasets (filled squares) and normal 2-D image datasets (open squares) are clustered based on process configurations 841-843. E.g., low temperature (right branch of decision leaf implementing a process configuration 841) and high rounds-per-minute of, e.g., a spin coater (left branch of decision leaf implementing a process configuration 843) leads to abnormal observations in the 2-D image datasets; whereas high temperature (left branch of decision leaf implementing a process configuration 841) and high pressure (left branch of decision leaf implementing a process configuration 842) leads to normal observations in the 2-D image datasets. This information can be used to deduce process states (e.g., to discriminate between the processes defined by process parameters 201-202-203 or 201-202-205, respectively; cf. FIG. 14).

FIG. 17 schematically illustrates a structure-free algorithm for RCA. FIG. 17 illustrates a decision tree graph 850. In FIG. 17, a scenario is illustrated in which a direct mapping is learned from the observed variables during the production phase 1002 (e.g., process configuration, 2-D image datasets) to hidden variables (process deviations) in a single shot. This approach is feasible if a large training data can be generated/simulated. In FIG. 17 normal observations—i.e., semiconductor structures 91, etc.—(open squares) and abnormal observations—i.e., defects 92—(filled squares) are clustered based on 2-D image datasets (decision leaf implementing process configuration 845) and observed variables (decision leafs implementing process configuration 841, 842). For examples, low temperature (right branch of decision leaf implementing process configuration 841) and high image pixel value (left branch of decision leaf implementing process configuration 845) mostly results in a faulty process, e.g., the process defined by the sequence of process parameters 201-202-205. High temperature (left branch of decision leaf implementing process configuration 841) and high pressure (left branch of decision leaf implementing process configuration 842) leads to normal process defined by the sequence of process parameters 201-202-203.

Hallucinating a 3-D image dataset from one or more 2-D image datasets can provide an auxiliary variable; such auxiliary variables can be used for structure-based algorithms. In this regard, considering the example illustrated in FIG. 14, the observed 2-D image datasets 762, 764 are the same. Upon regression from the 2-D image datasets to a probability distribution of 3-D image datasets—using, e.g., random forests or deep neural networks —, the observation would be mapped to corresponding possible 3-D image datasets 112-113 (here, containing spherical and cylindrical defects respectively with equal probability). This is illustrated in FIG. 18.

As illustrated in FIG. 18, the equal probability of 50% for the two 3-D image datasets 112, 113 containing the cylindrical defect and the spherical defect renders the operation of the RCA uncertain. Thus, such information can be utilized to perform another measurement of a 2-D image dataset, e.g., using a different pose of the imaging modality with respect to the wafer 90. Such a scenario is illustrated in FIG. 19. In FIG. 19, a shifted imaging axis 769 of the 2-D imaging technique (if compared to FIG. 18) is used to reduce ambiguity in in the hallucinated 3-D image dataset 112, 113, thereby improving reliability of the RCA.

Optionally, probability distribution over 3-D imaging datasets can be used to obtain a distribution over possible root causes. This information is useful as it indicates that the forthcoming RCA is unreliable (as there is an equal or almost equal probability for two different 3-D imaging datasets). This ambiguity can be alleviated by optimally measuring a second observation as shown in FIG. 19, e.g., varying the configuration of the 2-D imaging technique. Upon the second measurement, the algorithm can be more certain about its decision. Optionally, the probability distribution over the 3D volumes can also be used to obtain a probability distribution over the corresponding root causes.

As a general rule, defect localization or defect classification can be useful auxiliary information for the algorithms described herein. Referring to the example presented in FIG. 14, such information can be useful for distinguishing between the 2-D image datasets 761, 762, 764 that look similar locally (e.g., they all have circles). This is based on the finding that various algorithms discussed herein can be distracted by such similarity resulting in reduced performance. Although this can be solved by extensive training sets and repeated hard-negative mining, auxiliary information such as defect localization (if any) and their classes might be useful information. For example, identifying the position and type of the defects 92-1, 92-3 in the 2-D image datasets 762, 764 can help directly relate 2-D image datasets to their underlying processes instead of repeated training procedures. This is illustrated in FIG. 20.

FIG. 20 illustrates aspects with respect to defect class information. In FIG. 20, a classification 785 of the defect 92-1 is provided, that indicates that the target volume 700 resulting from the fabrication process 201-202-205 is most likely. Again, as this information is probabilistic in nature, the result can be a probability distribution over corresponding root causes.

FIG. 21 illustrates aspects with respect to the development phase 1001. Specifically, FIG. 21 illustrates aspects with respect to the training of the algorithms 192, 193 (cf. FIG. 7).

In FIG. 21, training data is obtained as 2-D image datasets 101-103 of a target volume 700, 3-D image datasets 901-903 of the same target volume 700, defect labels 971, and process parameters 972, e.g., a sequence of process steps, abnormalities in the process parameters, etc.

Then, the ML algorithm 192 for 3-D hallucination can be trained on the 2-D image datasets 101-103 and the 3-D image datasets 901-903. For example, a 3-D GAN could be trained by minimizing the error between the measured 3-D image datasets 901-903 and synthesized 3-D image datasets.

The ML algorithm 192 for defect localization can be trained on the labeled defects. The training of the ML algorithm 193 is also illustrated in FIG. 21.

Summarizing, above techniques have been described which facilitate an RCA or defects of semiconductor structures formed on a wafer. This is based on one or more ML algorithms that are trained on prior knowledge of the corresponding fabrication process. A 2-D image dataset is obtained during a wafer run in a production phase. Then, one or more process deviations of the wafer run from the predefined fabrication process can be determined and these one or more process deviations are associated with the root cause of the one or more defects.

Examples have been described in which 3-D image datasets are hallucinated from the 2-D image datasets, e.g., to provide a hidden variable serving as an input to the ML algorithm or a further algorithm that, e.g., may operate based on prior knowledge on interdependencies between multiple process parameters of the predefined fabrication process.

Summarizing, procedures have been described to enhance the amount of information gained from a 2-D imaging dataset by utilizing ML algorithms, in particular deriving the root cause or the probabilities of possible root causes for given defects. An RCA for defects augments a 2-D image dataset using prior knowledge, e.g., classification of defects, knowledge about the nominal manufacturing process, knowledge about the actual process parameters, etc.

In a development phase, according to some examples, pairs of 2-D image datasets and the corresponding root causes can be used as training data, and the ML algorithm is trained to map the 2-D image datasets on the corresponding root causes. Then in a production phase, only 2-D image datasets are available as input data, and the trained ML algorithm infers the root cause of the defects, or the probabilities of possible root causes from the 2-D image datasets.

Further, procedures to enhance the amount of information gained from a 2-D image dataset have been described which utilize ML algorithms. In particular inferring auxiliary information such as, e.g., 3-D characterization of the given defect or probabilities of possible 3-D characterizations that will help a further algorithm or an expert to determine the root cause or the probabilities of possible root causes for given defects. For example, a 3-D image dataset can be inferred as an auxiliary variable. This can include providing a collection of 2-D image datasets and associated auxiliary variables such as, e.g., 3-D image datasets of the defects. In a development phase, pairs of the 2-D image datasets and the corresponding auxiliary variables are used as training data, and an algorithm is trained to map the 2-D image datasets on the corresponding auxiliary variable. Then, the production phase is executed, and here only the 2-D image datasets are available as input data; the trained algorithm then infers the auxiliary variable (then, being hidden variables that cannot be directly observed), or the probabilities of possible auxiliary information from the 2-D image datasets.

Further, procedures to enhance the amount of information gained from a 2-D image dataset are described, by utilizing an ML algorithm. For example, the classification or the probabilities of possible classifications for given defects can be determined. The procedure includes a classification of defects in which one or more 2-D image datasets of a defect are augmented by additional information as, e.g., 3-D effect characterization, knowledge about the nominal manufacturing process, knowledge about the actual process conditions, etc. In a development phase pairs of 2-D image datasets and the corresponding classifications are used as training data, and an algorithm is trained to map the 2-D image datasets on the corresponding defect classes. In the production phase only 2-D image datasets are available as input data/observed variables, and the trained algorithm can infer the defect classification, or the probabilities of possible classifications from the 2-D image datasets.

Techniques to obtain ground-truth information for the training process have been described. For example, all corresponding observed variables and optionally auxiliary variables, as well as target variables are obtained through physical measurement techniques and/or through simulation.

In particular, the following EXAMPLEs have been described:

Example 1. A method, comprising:
 during a wafer run (950) of a wafer (90) using a predefined fabrication process: obtaining at least one 2-D image dataset (101-104, 761-764) of semiconductor structures (91) formed on the wafer including one or more defects (92), and
 based on at least one machine-learning algorithm (191-193) trained on prior knowledge on the fabrication process and based on the at least one 2-D image dataset: determining one or more process deviations (84-86) of the wafer run from the predefined fabrication process as a root cause of the one or more defects, based on the at least one 2-D image dataset (101-104, 761-764).

Example 2. The method of Example 1,
 wherein the at least one machine-learning algorithm (192) determines at least one hidden variable (111, 250) associated with the one or more defects (92),
 wherein the one or more process deviations (84-86, 121) are further determined based on a further algorithm (193) that receives the at least one hidden variable (111, 250) as an input.

Example 3. The method of Example 2,
 wherein the at least one hidden variable (111, 250) comprises at least one 3-D image dataset (112-114) or a probability distribution of 3-D image datasets of the one or more defects (92).

Example 4. The method of Example 2 or 3,
 wherein the at least one hidden variable (111, 250) comprises a localization (131) of the one or more defects (92).

Example 5. The method of any one of EXAMPLEs 2 to 4,
 wherein the at least one hidden variable (111, 250) comprises a classification (141) of the one or more defects (92).

Example 6. The method of any one of EXAMPLEs 2 to 5,
 wherein the further algorithm (193) is a further machine-learning algorithm trained on the prior knowledge on the fabrication process.

Example 7. The method of any one of EXAMPLEs 2 to 5,
 wherein the further algorithm (193) operates based on prior knowledge on interdependencies (211) between multiple process parameters (201-208) of the predefined fabrication process.

Example 8. The method of Example 7,
 wherein the multiple process parameters (201-208) are modeled using nodes of a graph (200),
 wherein the interdependencies (211) are modeled using edges between the nodes of the graph (200).

Example 9. The method of Example 7 or 8,
 wherein the multiple process parameters are associated with multiple process steps of the predefined fabrication process,
 wherein multiple 2-D images are obtained that are associated with different ones of the multiple process steps.

Example 10. The method of any one of the preceding EXAMPLEs, further comprising:
 prior to the wafer run, in a development phase (1001) of the predefined fabrication process: training the machine-learning algorithm using at least one of expert knowledge or invasive imaging.

Example 11. The method of Example 10,
 wherein the invasive imaging yields 3-D image datasets of the semiconductor structures.

Example 12. A device (910) comprising control circuitry (911) configured to:
 during a wafer run (950) of a wafer (90) using a predefined fabrication process: obtain at least one 2-D image dataset (101-104, 761-764) of semiconductor structures (91) formed on the wafer including one or more defects (92), and
 based on at least one machine-learning algorithm (191-193) trained on prior knowledge on the fabrication process and based on the at least one 2-D image dataset: determine one or more process deviations (84-86) of the wafer run from the predefined fabrication process as a root cause of the one or more defects, based on the at least one 2-D image dataset (101-104, 761-764).

Example 13. The device (910) of Example 12, wherein the control circuitry (911) is configured to perform the method of any one of EXAMPLEs 1 to 11.

Although the disclosure has been shown and described with respect to certain preferred embodiments, equivalents and modifications will occur to others skilled in the art upon the reading and understanding of the specification. The present disclosure includes all such equivalents and modifications and is limited only by the scope of the appended claims.

What is claimed is:

1. A method, comprising:
   during a wafer run of a wafer using a predefined fabrication process, obtaining a 2-D image dataset of 3-D semiconductor structures formed on the wafer, the wafer comprising a defect of one of the 3-D semiconductor structures;
   using a machine-learning algorithm to determine, based on the 2-D image dataset, a probability distribution of multiple 3-D image datasets imaging the defect, the probability distribution assigning probabilities to each of the multiple 3-D image datasets;
   responsive to the probability distribution of the multiple 3-D image datasets comprising equal probabilities for two or more of the multiple 3-D image datasets due to ambiguity of a projection the 3-D semiconductor structures into an imaging plane of the 2-D image dataset, obtaining a further 2-D image dataset of the 3-D semiconductor structures to reduce the ambiguity, the 2-D image dataset and the further 2-D image dataset depicting the 3-D semiconductor structures using different poses; and
   based on at least one of the 3-D image datasets, determining a process deviation of the wafer run from the predefined fabrication process as a root cause of the defect of the one of the 3-D semiconductor structures.

2. The method of claim 1, wherein the machine-learning algorithm is trained on the prior knowledge of the predefined fabrication process.

3. The method of claim 1, further comprising, prior to the wafer run and during a development phase of the predefined fabrication process, using invasive imaging to train the machine-learning algorithm, wherein the invasive imaging yields 3-D image datasets of the semiconductor structures.

4. A device, comprising:
   control circuitry configured to:
      during a wafer run of a wafer using a predefined fabrication process, obtain a 2-D image dataset of 3-D semiconductor structures formed on the wafer, the wafer comprising a defect of one of the 3-D semiconductor structures;
      use a machine-learning algorithm to determine, based on the 2-D image dataset, a probability distribution of multiple 3-D image datasets imaging the defect, the probability distribution assigning probabilities to each of the multiple 3-D image datasets;
      responsive to the probability distribution of the multiple 3-D image datasets comprising equal probabilities for two or more of the multiple 3-D image datasets due to ambiguity of a projection the 3-D semiconductor structures into an imaging plane of the 2-D image dataset, obtain a further 2-D image dataset of the 3-D semiconductor structures to reduce the ambiguity, the 2-D image dataset and the further 2-D image dataset depicting the 3-D semiconductor structures using different poses; and
      based on at least one of the 3-D image data sets, determine a process deviation of the wafer run from the predefined fabrication process as a root cause of the defect of the one of the 3-D semiconductor structures.

5. A system, comprising:
   control circuitry configured to:
      during a wafer run of a wafer using a predefined fabrication process, obtain a 2-D image dataset of 3-D semiconductor structures formed on the wafer, the wafer comprising a defect of one of the 3-D semiconductor structures; and
      use a machine-learning algorithm to determine, based on the 2-D image dataset, a probability distribution of multiple 3-D image datasets imaging the defect, the probability distribution assigning probabilities to each of the multiple 3-D image datasets;
      responsive to the probability distribution of the multiple 3-D image datasets comprising equal probabilities for two or more of the multiple 3-D image datasets due to ambiguity of a projection the 3-D semiconductor structures into an imaging plane of the 2-D image dataset, obtain a further 2-D image dataset of the 3-D semiconductor structures to reduce the ambiguity, the 2-D image dataset and the further 2-D image dataset depicting the 3-D semiconductor structures using different poses; and
      based on at least one of the 3-D image datasets, determine a process deviation of the wafer run from the predefined fabrication process as a root cause of the defect of the one of the 3-D semiconductor structures; and
   production equipment configured to implement the predefined fabrication process.

6. The system of claim 5, further comprising an image source.

7. The system of claim 5, further comprising at least one microscope selected from the group consisting of an optical microscope and a scanning electron microscope.

8. One or more machine-readable hardware storage devices comprising instructions that are executable by one or more processing devices to perform operations comprising the method of claim 1.

9. A system comprising:
   one or more processing devices; and
   one or more machine-readable hardware storage devices comprising instructions that are executable by the one or more processing devices to perform operations comprising the method of claim 1.

10. The system of claim 5, further comprising:
    an image source; and
    an interface,
    wherein the image source is configured to provide the 2-D image dataset to the interface, and the interface is configured to provide the 2-D image dataset to the control circuitry.

11. The system of claim 5, further comprising:
    an optical microscope; and
    an interface to the interface,
    wherein the optical microscope is configured to provide the 2-D image dataset to the interface, and the interface is configured to provide the 2-D image dataset to the control circuitry.

12. The system of claim 11, further comprising:
    a scanning electron microscope; and
    an interface to the interface,
    wherein the scanning electron microscope is configured to provide the 2-D image dataset to the interface, and the interface is configured to provide the 2-D image dataset to the control circuitry.

13. The system of claim 5, further comprising:
    a scanning electron microscope; and
    an interface to the interface, wherein the scanning electron microscope is configured to provide the 2-D image dataset to the interface, and the interface is configured to provide the 2-D image dataset to the control circuitry.

14. The method of claim 1, further comprising using an image source to collect the 2-D image dataset.

15. The method of claim 14, further comprising using production equipment to implement the predefined fabrication process.

16. The method of claim 1, further comprising using an optical microscope to collect the 2-D image dataset.

17. The method of claim 16, further comprising using a scanning electron microscope to collect the 2-D image dataset.

18. The method of claim 17, further comprising using production equipment to implement the predefined fabrication process.

19. The method of claim 1, further comprising using a scanning electron microscope to collect the 2-D image dataset.

20. The method of claim 1, further comprising using production equipment to implement the predefined fabrication process.

* * * * *

UNITED STATES PATENT AND TRADEMARK OFFICE
CERTIFICATE OF CORRECTION

| | | |
|---|---|---|
| PATENT NO. | : 12,045,969 B2 | Page 1 of 1 |
| APPLICATION NO. | : 17/034640 | |
| DATED | : July 23, 2024 | |
| INVENTOR(S) | : Jens Timo Neumann et al. | |

It is certified that error appears in the above-identified patent and that said Letters Patent is hereby corrected as shown below:

In the Drawings

Sheet 3 of 14, Figure 4, Reference Numeral 1012, please replace "algoirthm" with -- algorithm --.

In the Specification

Column 11, Lines 36-53, please delete the paragraph "3-D image datasets can be valuable for relaxing the need for precise information on the fabrication process for the algorithm. Therefore, such information serves as useful auxiliary information for structure-free models. In this regard, while 2-D image dataset and corresponding 3-D image dataset are observed during the development phase 1001, typically only 2-D image datasets are observed during the production phase 1002. Therefore, a 3-D image dataset or a probability distribution that might have resulted in the observed 2-D image dataset needs to be inferred. This can be solved as a regression problem that maps images from 2-D to 3-D, e.g., using support vector regression, random forests or deep neural networks. The respective ML algorithm 192 is illustrated in FIG. 7. Alternatively, a distribution of 3-D images can also be obtained through Generative Adversarial Networks (GANs) which learns statistical correlations between image manifolds of 2-D and 3-D manifolds." and insert the same at Column 11, Line 37, as a new paragraph.

Column 14, Line 53, please replace "an the" with -- the --.

Column 15, Line 54, please replace "in in" with -- in --.

Signed and Sealed this
Twenty-sixth Day of November, 2024

Katherine Kelly Vidal
*Director of the United States Patent and Trademark Office*